United States Patent [19]
Liu

[11] Patent Number: 6,057,230
[45] Date of Patent: May 2, 2000

[54] DRY ETCHING PROCEDURE AND RECIPE FOR PATTERNING OF THIN FILM COPPER LAYERS

[75] Inventor: Chi Kang Liu, Tao-Yuan County, Taiwan

[73] Assignee: Taiwan Semiconductor Manufacturing Company, Ltd., Hsin-Chu, Taiwan

[21] Appl. No.: 09/156,051

[22] Filed: Sep. 17, 1998

[51] Int. Cl.[7] ............................................. H01L 21/4763
[52] U.S. Cl. ..................... 438/637; 438/622; 438/627; 438/625; 438/689; 438/712
[58] Field of Search ...................... 438/400, 453, 438/592, 593, 594–596, 622, 625, 627, 628, 642, 643, 644, 637, 689, 712

[56] References Cited

U.S. PATENT DOCUMENTS

| | | | |
|---|---|---|---|
| 5,447,599 | 9/1995 | Li et al. | 216/17 |
| 5,505,322 | 4/1996 | Shinohara et al. | 216/78 |
| 5,539,256 | 7/1996 | Mikagi | 257/763 |
| 5,569,627 | 10/1996 | Shinohara et al. | 437/228 |
| 5,578,166 | 11/1996 | Hirota | 156/643.1 |
| 5,591,302 | 1/1997 | Shinohara et al. | 156/661 |
| 5,747,379 | 5/1998 | Huang et al. | 438/586 |
| 5,792,672 | 8/1998 | Chan et al. | 438/6 |
| 5,866,947 | 2/1999 | Wang et al. | 257/764 |
| 5,930,669 | 7/1999 | Uzoh | 438/627 |
| 5,960,317 | 9/1999 | Jeong | 438/633 |
| 5,960,320 | 9/1999 | Park | 438/688 |
| 5,976,264 | 11/1999 | McCullough et al. | 134/2 |
| 5,976,970 | 11/1999 | Dalal et al. | 438/637 |
| 5,976,972 | 11/1999 | Inohara et al. | 438/640 |
| 5,976,975 | 11/1999 | Joshi et al. | 438/672 |

*Primary Examiner*—Charles Bowers
*Assistant Examiner*—Robert A. Hullinger
*Attorney, Agent, or Firm*—George O. Saile; Stephen B. Ackerman

[57] ABSTRACT

A method for fabricating a copper, or a copper-titanium nitride-titanium, interconnect structure, using a low temperature RIE patterning procedure, has been developed. The RIE patterning procedure features the use of $SiCl_4$ and nitrogen, as reactants, with amount of nitrogen supplied, being equal to, or greater than, the $SiCl_4$ level. The addition of nitrogen, to the etching ambient, results in the formation of a non-cross-linked, by-product, which is easily removed during the patterning procedure, this not interfering with the creation of interconnect structure. Without the addition of nitrogen, a cross-linked, by-product, would be formed, during the low temperature RIE procedure, with the redeposited, cross-linked, by-product, interfering with the patterning of the copper interconnect structure.

14 Claims, 3 Drawing Sheets

Cross-linked by-Product — CuClx

Non Cross-linked by-Product — CuClxNy

DRY ETCHING PROCEDURE AND RECIPE FOR PATTERNING OF THIN FILM COPPER LAYERS

BACKGROUND OF THE INVENTION (1) Field of the Invention

The present invention relates to a method used to create metal interconnect structures, for semiconductor devices, and more specifically to a method used to pattern thin copper layers, used for metal interconnect structures.

(2) Description of Prior Art

The objectives of the semiconductor industry are to continually improve performance of semiconductor devices, while still attempting to decrease the cost of these same semiconductor devices. Micro-miniaturization, or the ability to create semiconductor devices with sub-micron features, have allowed these performance and cost objectives to be successfully addressed. For example smaller features result in a decrease in performance degrading capacitances and resistances, for device regions in the semiconductor substrate. In addition the use of sub-micron features, allow smaller semiconductor chips to be realized, however still possessing device densities, comparable to densities achieved with larger semiconductor chip counterparts. This allows more chips to be realized from a specific size starting substrate, thus reducing the processing cost for a specific semiconductor chip.

One area in which micro-miniaturization has in some respects adversely influenced performance, is the creation of sub-micron, metal interconnect structures. Although the resistance of metal interconnect structures is reduced by the decreasing lengths of the metal runs, a reduction in the width of the metal lines, and of the thickness of the metal lines, necessitated in order to reduce topography, results in resistance increases for the narrower, thinner metal lines, as well as increased risk of electromigration failures, due to the higher current densities carried by the narrower, thinner metal lines. One solution for higher resistance, and higher electromigration risk, for thinner metal interconnect structures, is the use of lower resistivity, copper interconnect structures, in place of the higher resistivity, aluminum based, interconnect structures. The use of copper, in addition to offering lower sheet resistance, than aluminum counterparts, also offers increased resistance to electromigration failure, as a result of the increased self-diffusivity of copper, when compared to aluminum counterparts.

The use of copper interconnect structures, however, introduce several new concerns, that were not relevant with the aluminum based metallization. For example the patterning procedure, used to obtain the copper interconnect structures, is accomplished via a reactive ion etching, (RIE), technology, using a photoresist shape as an etch mask, and using a chlorine based chemistry as the etchant gas for the copper layer. However during the etching procedure, using a chlorine etch chemistry, a by-product, such as $CuCl_x$ can be formed, redepositing on regions in which copper still remains unetched, and thus interfering with the patterning procedure. One method used to remove the $CuCl_x$ by-product, during the etch procedure, thus minimizing the effect of the redeposited byproduct, has been the use of higher RIE temperatures, in the range of about 200° C. However the higher RIE temperatures, although removing unwanted by-products via vaporization, or increased RIE bombardment, can result in flowing, or softening of the masking photoresist shapes, resulting in irregular copper shapes.

This invention will offer a solution for the removal of by-products of a chlorine based, RIE procedure, used for copper patterning, performed at RIE temperature in which the integrity of the masking photoresist shapes is not adversely influenced. The addition of nitrogen, in amounts equal to, or greater than, the amount of the chlorine based etchant, results in a non cross-linked by-product, $CuCl_xN_y$, which is simultaneously, and quickly removed, during the RIE procedure, not interfering with the copper patterning procedure. Prior art, such as Shinohara et al, in U.S. Pat. No. 5,505,322, describe a process for patterning copper, using an etch chemistry comprised of a halogen gas, and nitrogen, however that prior art also features the use of oxygen, as a major etch component. The use of oxygen can deleteriously attack the masking photoresist shape, as well as forming a oxide on the exposed sides of the patterned copper interconnect structure. This present invention accomplishes copper patterning, at low temperatures, however without the use of oxygen additions.

SUMMARY OF THE INVENTION

It is an object of this invention to use copper for low resistance, interconnect structures.

It is another object of this invention to create copper interconnect structures via an RIE procedure, performed at temperatures about 60° or less, using a photoresist shape as a mask.

It is still another object of this invention to add an amount of nitrogen, to the RIE ambient, equal to, or greater than, the amount of chlorine based etchant used.

In accordance with the present invention, a method is described for forming copper interconnect structures, using photolithographic and low temperature RIE, patterning procedures, featuring a RIE chemistry comprised of a chlorine based etchant, with the addition of an equal, or greater amount of nitrogen gas. A semiconductor substrate, with exposed surfaces comprised of dielectric materials, and semiconductor materials, is provided. A first embodiment of this invention encompasses the deposition of a copper layer on an underlying dielectric layer, followed by the formation of a masking photoresist shape, on the underlying copper layer. A RIE procedure is next performed, at a temperature of 60° C., or below, using a chlorine based etchant, such as $SiCl_4$, with the addition of nitrogen, at a flow equal to, or greater than, the flow of $SiCl_4$. This RIE procedure, and etch chemistry, removes regions of copper, not protected by the masking photoresist shape, and also removes a non cross-linked, $CuCl_xN_y$, reaction by-product, resulting in the desired copper interconnect structure.

A second embodiment of this invention employs a composite layer, comprised of an underlying, adhesive layer of titanium, and an overlying barrier layer of titanium nitride, deposited on the underlying dielectric layer, and followed by the deposition of the copper layer, on the underlying barrier and adhesive composite layer. After formation of the masking photoresist shape, on the underlying copper layer, a RIE procedure, using identical conditions and etchants, used in the first embodiment, is again used to pattern the copper layer, as well to pattern the titanium nitride layer, and the titanium layer, resulting in the desired copper interconnect structure, on the composite barrier and adhesive layers.

BRIEF DESCRIPTION OF THE INVENTION

The object and other advantages of this invention are best described in the preferred embodiment with reference to the drawings that include:

FIGS. 1 and 2a, schematically, in cross-sectional style, show the stages of formation of a copper interconnect structure, using a RIE ambient, without the addition of nitrogen, to the RIE ambient, resulting in a cross-linked, RIE by-product, at the conclusion of the RIE procedure.

FIG. 2b, shows the chemical structure of the cross-linked, by-product of the RIE procedure, performed without the addition of nitrogen to the RIE ambient.

FIG. 3a, schematically, in cross-sectional style, shows the result of patterning a copper layer, using a RIE ambient, featuring the addition of nitrogen, and resulting in an absence of a cross-linked, RIE by-product, at the conclusion of the RIE procedure.

FIG. 3b, shows the chemical structure of the non cross-linked, RIE by-product, obtained via the addition of nitrogen, to the RIE ambient.

FIGS. 4–5, schematically, in cross-sectional style, show the stages of forming a copper interconnect structure, on an underlying composite, barrier-adhesive layer, using a RIE ambient, featuring the addition of nitrogen to the RIE ambient, resulting in an absence of a cross-linked, RIE by-product, at the conclusion of the RIE procedure.

DESCRIPTION OF THE PREFERRED EMBODIMENTS

The method of fabricating a copper interconnect structure, using a low temperature RIE procedure, and featuring the addition of nitrogen to the RIE ambient, will now be described in detail. The use of copper interconnect structures, obtained via patterning procedures described in this invention, can be used for any level of metal interconnect, such as a first level interconnect structure, either directly contacting underlying active device regions, in a semiconductor substrate, or contacting a conductive plug, which in turn contacts underlying semiconductor device regions, or contacts other metal interconnect structures. The copper interconnect structure of this invention can also be used for upper levels of metal interconnect structures.

Figure 1:
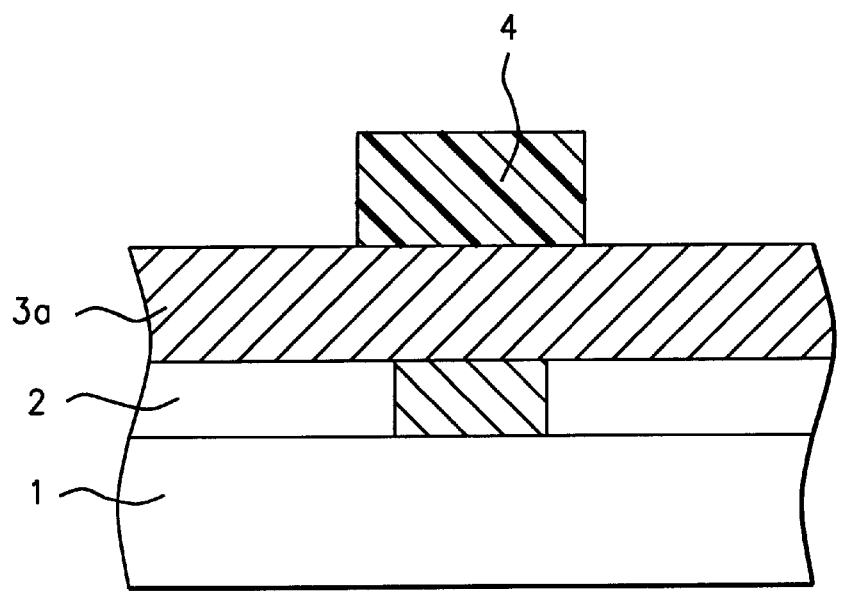

FIG. 1, schematically shows the initial stages of forming a copper interconnect structure. This invention will be described for a copper interconnect structure, formed directly, and entirely on, an underlying insulator layer. However, if desired, contact openings, in dielectric layers, exposing underlying, and overlying conductive regions, (not shown in the drawings), can be formed, then filled with the copper layer, or with conductive plugs, allowing contact between the copper interconnect structure, patterned using conditions described in this invention, and underlying, or overlying conductive structures, to be realized.

A semiconductor substrate 1, and an insulator layer 2, are shown schematically in FIG. 1. Insulator layer 2, can be a silicon oxide layer, a silicon nitride layer, a borophosphosilicate layer, or a phosphosilicate layer. Finally, for the first embodiment of this invention, a copper layer 3a, is deposited, via R.F. sputtering, or chemical vapor deposition, (CVD), procedures, to a thickness between about 4000 to 8000 Angstroms. If the CVD option is employed, a plasma vapor deposition/CVD tool is used, at a temperature between about 150 to 450° C., using Copper-Hexafluoroacetyacetone-Trimethylvintlsilane, (Cu-HFAC-TMVS) as reactants. A photoresist shape 4, shown schematically in FIG. 1, is formed on copper layer 3a, to be used as etch for the subsequent definition of the copper interconnect structure.

Figure 2A:
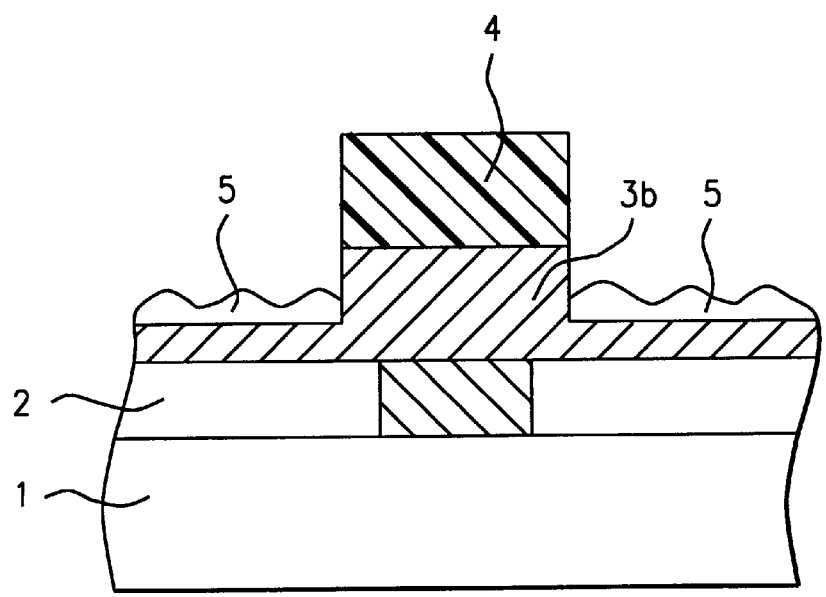
Figure 2B:
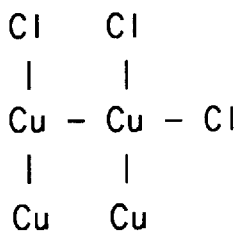

FIG. 2a, schematically shows the result of the patterning procedure used to create copper interconnect structure 3b. A RIE procedure, at a temperature of about 60° or less, is used, at a power between about 230 to 250 watts, and at a pressure between about 65 to 75 mtorr. The reactants used in this procedure are $SiCl_4$, at a flow between about 11 to 13 sccm, and argon, at a flow between about 14 to 16 sccm. As the RIE procedure progresses, in terms of copper etching, a cross-linked, by-product 5, comprised of $CuCl_x$, is formed, redepositing on region of the copper layer, exposed to the RIE bombardment. At the temperature of about 60° C., used for this procedure, the cross-linked, by-product 5, is only slowly removed, thus interfering with the patterning of the copper layer. If the temperature of the RIE procedure were raised to about 200° C., the cross-linked, by-product, would be removed at a faster rate, allowing exposed copper regions to be more effectively removed, however the higher temperature RIE procedure, would result in a softening, or a distortion of masking photoresist shape 4, resulting in a distorted copper interconnect structure. FIG. 2b, shows the chemical structure of cross-linked, by-product 5, obtained using optical microscopy procedures.

Figure 3A:
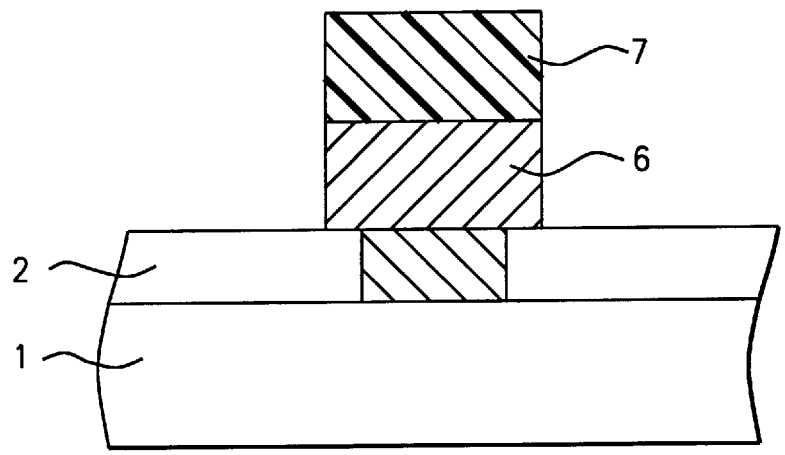
Figure 3B:
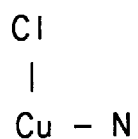

FIG. 3a, schematically shows the result of a copper interconnect structure, formed via a low temperature RIE procedure, however without the formation of a cross-linked, by-product. A copper layer, at a thickness between about 4000 to 8000 Angstroms, is obtained using the identical deposition conditions, previously used for copper layer 3a. A photoresist shape 7, is used as a mask, to allow a RIE procedure, performed at a temperature of about 60° C., or less, at a pressure between about 65 to 75 mtorr, and at a power between about 230 to 250 watts, to create copper interconnect structure 6, schematically shown in FIG. 3a. The reactants used in this procedure were again $SiCl_4$, at a flow between about 11 to 13 sccm. However for this procedure a nitrogen flow between about 14 to 16 sccm, was used in place of the argon. The use of nitrogen resulted in a non-cross-linked, by-product, $CuCl_xN_y$, redeposited on the exposed copper layer, during the RIE procedure. However non-cross-linked, by-product, $CuCl_xN_y$, unlike cross-linked, by-product, $CuCl_x$, is easily, and quickly removed during the low temperature RIE procedure, thus not interfering with the patterning of copper, and resulting in the desired copper interconnect structure 6. The chemical structure of $CuCl_x$, is shown in FIG. 3b.

Figure 4:
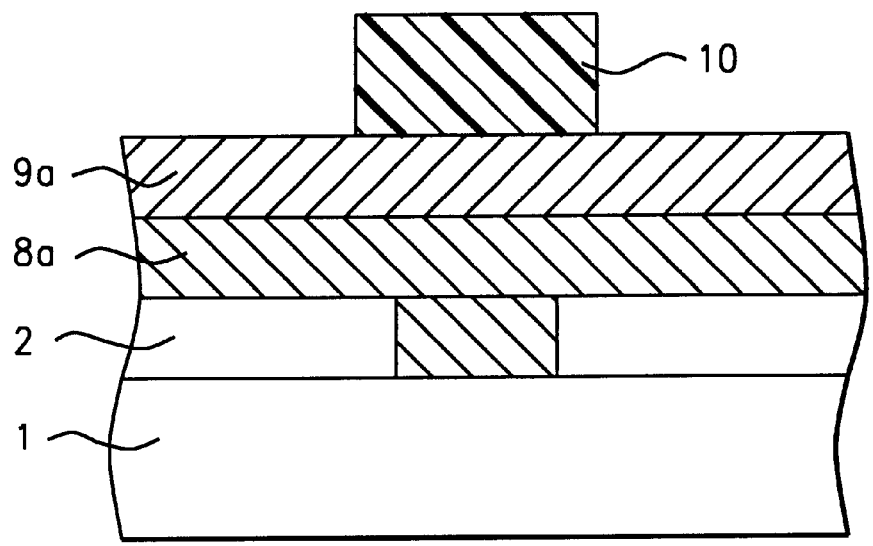
Figure 5:
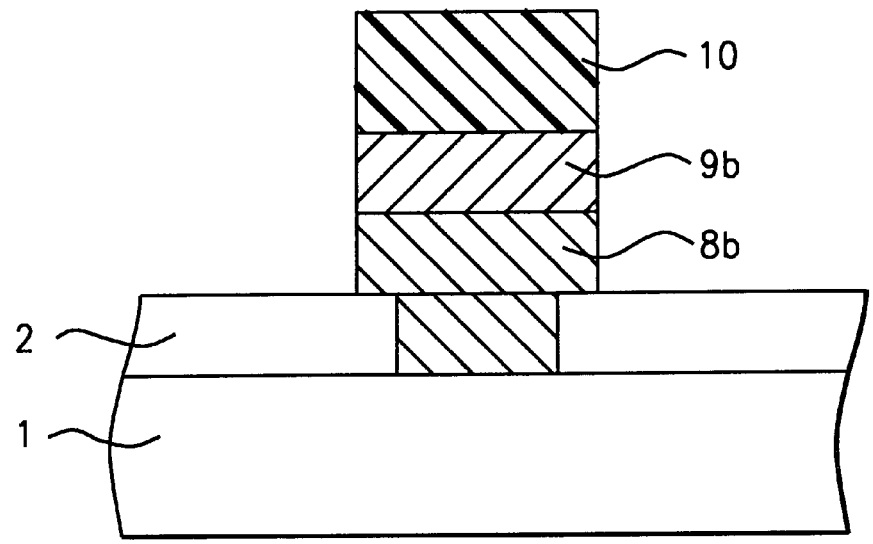

A second embodiment of this invention features the formation of a copper-titanium nitride-titanium, interconnect structure, patterned using the identical RIE procedure, used in the previous embodiment, featuring the patterning of a copper interconnect structure. A composite layer 8a, comprised of an underlying titanium layer, to be used as an adhesive layer, allowing improved adhesion between a subsequent copper structure, and underlying insulator 2, to be realized, and an overlying titanium nitride layer, to be used as a barrier layer, preventing copper from reaching underlying insulator layer 2, or from reaching semiconductor substrate 1, is deposited via R.F. sputtering, with the titanium layer deposited to a thickness between about 250 to 1400 Angstroms, while the titanium nitride layer is deposited to a thickness between about 250 to 1400 Angstroms. Composite layer 8a, comprised of a titanium nitride layer overlying a titanium layer, can also be obtained via CVD procedures. Copper layer 9a, is deposited via R.F. sputtering, or plasma vapor deposition/CVD procedures, using Cu-HFAC-TMVS as reactants. Photoresist shape 10, to be used as an RIE etch mask, is formed on copper layer 9a. The result of these depositions is schematically shown in FIG. 4. A low temperature RIE procedure, performed at a temperature of 60°, or less, at a pressure between about 65 to 75 mtorr, and at a power between about 230 to 250 watts, is used to pattern copper layer 9a, and composite layer 8a, resulting in copper interconnect structure 9b, overlying titanium nitride-titanium composite shape 8b. The RIE ambient, used to etch copper, titanium nitride, and titanium, was comprised of $SiCl_4$, at a flow between about 11 to 13 sccm, while the addition of nitrogen, to the RIE ambient, at a flow between about 14 to 16 sccm, allowed the RIE procedure to proceed without the formation of cross-linked, by-product, $CuCl_x$. The result of the patterning procedure is schematically shown in FIG. 5.

While this invention has been particularly shown and described with reference to the preferred embodiments thereof, it will be understood by those skilled in the art that various changes in form and details may be made without departing from the spirit and the scope of this invention.

What is claimed is:

1. A method for forming a copper interconnect structure, on a semiconductor substrate, comprising the steps of:

providing a insulator layer, on said semiconductor substrate, with openings in said insulator layer, exposing underlying conductive elements;

depositing a copper layer on said insulator layer, and on said underlying conductive elements, exposed in the openings in said insulator layer;

forming a photoresist shape, on said copper layer;

patterning of said copper layer, using said photoresist shape as a mask, to form said copper interconnect structure, via a low temperature RIE procedure performed at about 60° C. or less, using a RIE ambient comprised of a halogen containing reactant, and nitrogen gas and without oxygen; and removing said photoresist shape.

2. The method of claim 1, wherein said underlying conductive elements are active device regions in said semiconductor substrate.

3. The method of claim 1, wherein said underlying conductive elements are conductive plugs, used for contact to active device regions in said semiconductor substrate, or used to contact other metal interconnect structures.

4. The method of claim 1, wherein said copper layer is deposited using CVD procedures, at a temperature between about 150 to 450° C., to a thickness between about 4000 to 8000 Angstroms, using Cu-HFAC-TMVS as reactants.

5. The method of claim 1, wherein the patterning of said copper layer is performed via RIE procedures, at a pressure between about 65 to 75 mtorr, and using a power between about 230 to 250 watts.

6. The method of claim 1, wherein the patterning of said copper layer is performed via RIE procedures, using between about 11 to 13 sccm of $SiCl_4$, and between about 14 to 16 sccm of nitrogen, as reactants.

7. A method for forming a copper-titanium nitride-titanium interconnect structure, on a semiconductor substrate, using a low temperature RIE procedure, and using a $SiCl_4$ and nitrogen ambient, for patterning of said copper-titanium nitride-titanium interconnect structure, comprising the steps of:

providing an insulator layer, on said semiconductor substrate, with openings in said insulator layer, exposing underlying conductive elements;

depositing a titanium layer, on said insulator layer, and on underlying conductive elements exposed in openings in said insulator layer;

depositing a titanium nitride layer, on said titanium layer;

depositing a copper layer, on said titanium nitride layer;

forming a photoresist shape on said copper layer;

patterning of said copper layer, of said titanium nitride layer, and of said titanium layer, using said photoresist shape as a mask, via said low temperature RIE procedure performed at about 60° C. or less, using $SiCl_4$, and nitrogen and without oxygen, as reactants, to form said copper-titanium nitride-titanium interconnect structure; and removing said photoresist shape.

8. The method of claim 7, wherein said underlying conductive elements are active device regions in said semiconductor substrate.

9. The method of claim 7, wherein said underlying conductive elements are conductive plugs, used in turn to contact active device regions in said semiconductor substrate, or used to contact other metal interconnect structures.

10. The method of claim 7, wherein said titanium layer is obtained via R.F. sputtering, or via CVD procedures, at a thickness between about 250 to 1400 Angstroms.

11. The method of claim 7, wherein said titanium nitride layer, is obtained using R.F. sputtering, or CVD procedures, to a thickness between about 250 to 1400 Angstroms.

12. The method of claim 7, wherein said copper layer is deposited in said CVD tool, at a temperature between about 150 to 450° C., to a thickness between about 4000 to 8000 Angstroms, using Cu-HTAC-TMVS as reactants.

13. The method of claim 7, wherein the patterning of said copper-titanium nitride-titanium interconnect structure, is performed via an RIE procedure, at a pressure between about 65 to 75 mtorr, and at a power between about 230 to 250 watts.

14. The method of claim 7, wherein the patterning of said copper-titanium nitride-titanium interconnect structure, is performed via an RIE procedure, using between about 11 to 13 sccm of $SiCl_4$, and between about 14 to 16 sccm of nitrogen, as reactants.

* * * * *